(12) United States Patent
Chiang (10) Patent No.: US 10,825,769 B2
(45) Date of Patent: Nov. 3, 2020

(54) SEMICONDUCTOR DEVICES AND METHODS FOR MANUFACTURING THE SAME (71) Applicant: Winbond Electronics Corp., Taichung (TW)

(72) Inventor: Ming-Chung Chiang, Changhua County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/385,033

(22) Filed: Apr. 16, 2019

(65) Prior Publication Data

US 2019/0318992 A1   Oct. 17, 2019

(30) Foreign Application Priority Data

Apr. 16, 2018 (TW) ............................. 107112890 A (51) Int. Cl.
*H01L 23/525* (2006.01)
*H01L 23/522* (2006.01)
(Continued)

(52) U.S. Cl.
CPC .... *H01L 23/5256* (2013.01); *H01L 21/31116* (2013.01); *H01L 21/76832* (2013.01); *H01L 23/5226* (2013.01); *H01L 23/53295* (2013.01)

(58) Field of Classification Search
CPC ............. H01L 23/5226; H01L 23/5256; H01L 23/535; H01L 23/53295; H01L 24/18; H01L 27/14636; H01L 2224/18
See application file for complete search history.

(56) References Cited

U.S. PATENT DOCUMENTS

| 5,451,810 A | 9/1995 | Tigelaar et al. |
| 5,985,765 A | 11/1999 | Hsiao et al. |

(Continued)

FOREIGN PATENT DOCUMENTS

| CN | 1213165 A | 4/1999 |
| CN | 1638112 A | 7/2005 |

(Continued)

OTHER PUBLICATIONS

Office Action dated Aug. 12, 2020 in Chinese Application No. 210810397455.X.

*Primary Examiner* — Hsien Ming Lee
(74) *Attorney, Agent, or Firm* — Muncy, Geissler, Olds & Lowe, P.C.

(57) ABSTRACT

A method for manufacturing a semiconductor device is provided. The method includes providing a substrate having a first region and a second region. The method also includes forming an interconnection structure on the first region and a fuse structure on the second region. The method further includes forming a first conductive pad on the interconnection structure. In addition, the method includes forming a capping layer, an etching stop layer and a dielectric layer to cover the first conductive pad and the fuse structure. The method further includes performing an etching process so that a first opening is formed to expose the conductive pad and a second opening is formed directly above the fuse structure. During the etching process, the first dielectric layer has a first etching rate, and the etching stop layer has a second etching rate that is lower than the first etching rate.

19 Claims, 5 Drawing Sheets

(51) Int. Cl.
*H01L 21/768* (2006.01)
*H01L 21/311* (2006.01)
*H01L 23/532* (2006.01)

(56) References Cited

U.S. PATENT DOCUMENTS

| | | | |
|---|---|---|---|
| 6,677,226 B1 * | 1/2004 | Bowen | H01L 23/5258 257/E23.02 |
| 2007/0254470 A1 | 11/2007 | Jung | |
| 2008/0293230 A1 | 11/2008 | Hosoda et al. | |
| 2009/0163021 A1 | 6/2009 | Ryu | |

FOREIGN PATENT DOCUMENTS

| | | |
|---|---|---|
| CN | 1645565 A | 7/2005 |
| CN | 108630657 A | 10/2018 |
| TW | I544895 B | 8/2003 |
| TW | I304631 B | 12/2008 |
| TW | I387025 B1 | 2/2013 |

\* cited by examiner

SEMICONDUCTOR DEVICES AND METHODS FOR MANUFACTURING THE SAME

CROSS REFERENCE TO RELATED APPLICATIONS

This application claims priority of Taiwan Patent Application No. 107112890 filed on Apr. 16, 2018, the entirety of which is incorporated by reference herein.

BACKGROUND OF THE INVENTION

Field of the Invention

The present invention relates to a semiconductor device, and in particular to a semiconductor device with a fuse structure.

Description of the Related Art

Various consumer electronic devices have recently become fashionable. As a result, the demand for volatile memory is increasing. Dynamic random access memory is a mainstream type of volatile memory. Although the semiconductor devices that currently exist are sufficient to meet their original intended use, they are not satisfactory in all respects. Therefore, we still need to sustain our efforts.

BRIEF SUMMARY OF THE INVENTION

The disclosure provides a method for manufacturing a semiconductor device. The method includes providing a semiconductor substrate. The semiconductor substrate has a first region and a second region adjacent to the first region. The method also includes forming an interconnection structure on the first region of the semiconductor substrate and a fuse structure on the second region of the semiconductor substrate. The method further includes forming a first conductive pad on the interconnection structure. The first conductive pad is electrically connected to the interconnection structure. In addition, the method includes forming a capping layer to cover the first conductive pad and the fuse structure. The method also includes forming an etching stop layer to cover the capping layer. The method further includes forming a first dielectric layer to cover the etching stop layer and performing a first etching process to remove the first dielectric layer, the etching stop layer and the capping layer so that a first opening is formed in the first region to expose the first conductive pad and a second opening is formed directly above the fuse structure. During the first etching process, the first dielectric layer has a first etching rate, and the etching stop layer has a second etching rate that is lower than the first etching rate.

The disclosure provides a semiconductor device. The semiconductor device includes a semiconductor substrate. The semiconductor substrate has a first region and a second region adjacent to the first region. The semiconductor device also includes an interconnection structure and a fuse structure disposed on the first region and the second region of the semiconductor substrate, respectively. The semiconductor device further includes a first dielectric layer covering the interconnection structure and the fuse structure, and a first conductive pad disposed on the interconnection structure. The first conductive pad is electrically connected to the interconnection structure. In addition, the semiconductor device includes a capping layer disposed on the first region and the second region of the semiconductor substrate. The capping layer covers a sidewall of the first conductive pad. The semiconductor device also includes an etching stop layer disposed on the second region of the semiconductor substrate. The etching stop layer covers the capping layer. The semiconductor device further includes a second dielectric layer disposed on the etching stop layer and the capping layer. Furthermore, the semiconductor device includes a first opening disposed on the fuse structure and the second region of the semiconductor substrate. The first opening removes the second dielectric layer, the etching stop layer, the capping layer and a portion of the first dielectric layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different material layers of the invention. Specific examples of components and arrangements are described below to simplify the present disclosure. These are, of course, merely examples and are not intended to be limiting. For example, the formation of a first material layer over or on a second material layer in the description that follows may include embodiments in which the first and second material layers are formed in direct contact, and may also include embodiments in which additional material layers may be formed between the first and second material layers, such that the first and second material layers may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value. The stated value of the present disclosure is an approximate value. When there is no specific description, the stated value includes the meaning of "about" or "substantially".

Figure 1A:
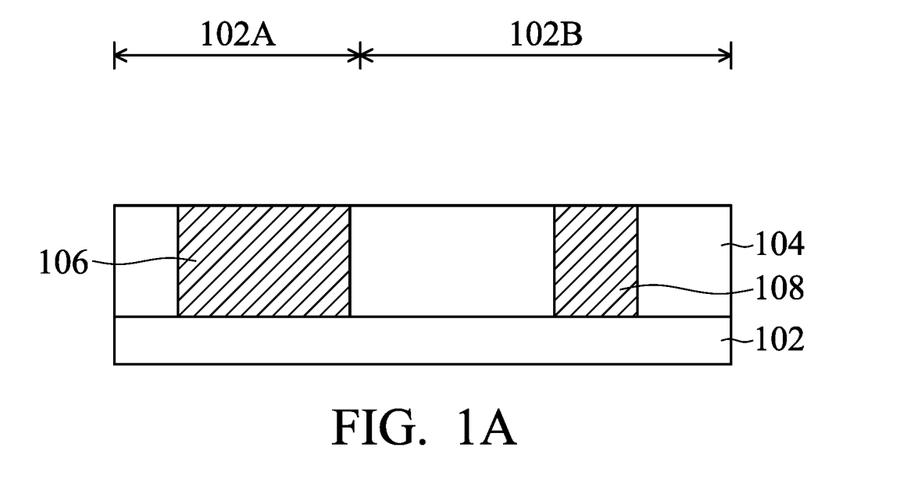
FIGS. 1A to 1H are cross-sectional representations of various stages of forming a semiconductor device in accordance with some embodiments.

Referring to FIGS. 1A-1H, FIGS. 1A-1H are cross-sectional representations of various stages of forming a semiconductor device 100A in accordance with some embodiments. As shown in FIG. 1A, a semiconductor substrate 102 is provided. In some embodiments, the semiconductor substrate 102 has a first region 102A and a second region 102B that is adjacent to the first region 102A. In addition, a dielectric layer 104, an interconnection structure 106 and a fuse structure 108 are formed on the semiconductor substrate 102. As shown in FIG. 1A, the interconnection structure 106 is formed on the first region 102A, the fuse structure 108 is formed on the second region 102B.

The semiconductor substrate 102 may include an integrated circuit (IC) therein. The IC may include various passive and active microelectronic devices, such as thin film resistors, other capacitors (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, and other types of transistors. In some embodiments, the semiconductor substrate 102 includes a dynamic random access memory (DRAM).

The dielectric layer 104 is made of silicon nitride, silicon oxynitride, silicon carbide, silicon oxide, silicon carbon nitride, another suitable material, or a combination thereof. The dielectric layer 104 may be formed by deposition process. The deposition process includes chemical vapor deposition (CVD), physical vapor deposition (PVD), atomic layer deposition (ALD), high-density plasma CVD (HDP-CVD), metal organic CVD (MOCVD), remote plasma CVD (RPCVD), plasma-enhanced CVD (PECVD), plating, another suitable process, or a combination thereof.

The interconnection structure 106 and the fuse structure 108 include conductive materials, such as aluminum (Al), copper (Cu), tungsten (W), titanium (Ti), tantulum (Ta), titanium nitride (TiN), tantalum nitride (TaN), nickel silicide (NiS), cobalt silicide (CoSi), tantulum carbide (TaC), tantulum silicide nitride (TaSiN), tantalum carbide nitride (TaCN), titanium aluminide (TiAl), titanium aluminide nitride (TiAlN), other applicable conductive materials, or a combination thereof.

In some embodiments, at first, a dielectric material layer is deposited on the substrate. Next, a photolithography and an etching process are performed to form openings in the dielectric layer on the first region 102A and the second region 102B. Next, a conductive material is filled into the openings to form the interconnection structure 106 and the fuse structure 108. The photolithography process includes photoresist coating (e.g., spin-on coating), soft baking, mask alignment, exposure, post-exposure baking, developing the photoresist, rinsing and drying (e.g., hard baking). The photolithography process is also implemented or replaced by other proper methods such as maskless photolithography, electron-beam writing and ion-beam writing. Examples of the etching process include dry etching, wet etching, and other etching methods.

Figure 1B:
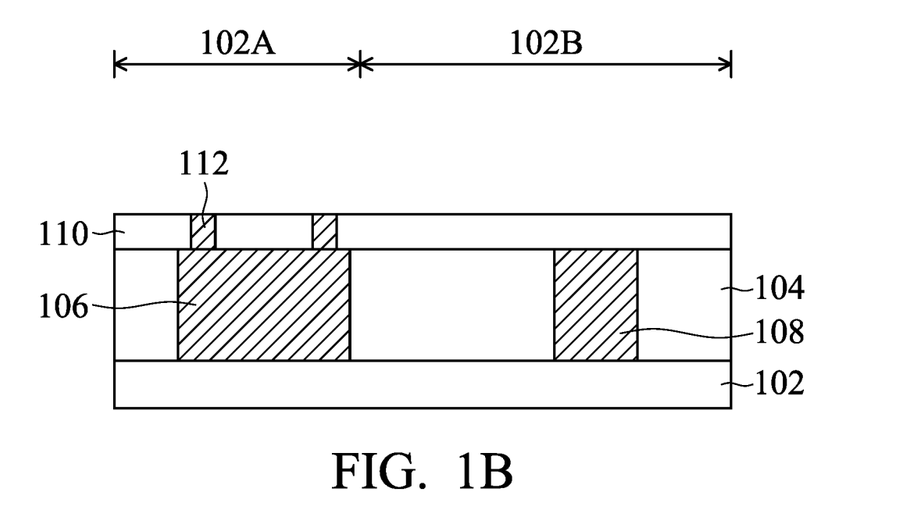

Next, the dielectric layer 110 is deposited on the semiconductor substrate 102, and via structures 112 are formed in the dielectric layer 110 as shown in FIG. 1B. In some embodiments, the dielectric layer 110 is an oxide layer or another applicable insulating material. In some embodiments, the thickness of the dielectric layer 110 is in a range of about 100 nm to about 500 nm. As shown in FIG. 1B, the via structures 112 are formed on the first region 102A and penetrate the dielectric layer 110. In addition, the via structures 112 are electrically connected to the interconnection structure 106. The material and the method for forming the via structure 112 may be similar to or the same as those of the interconnection structure 106 shown in FIG. 1A, and are not repeated herein.

Figure 1C:
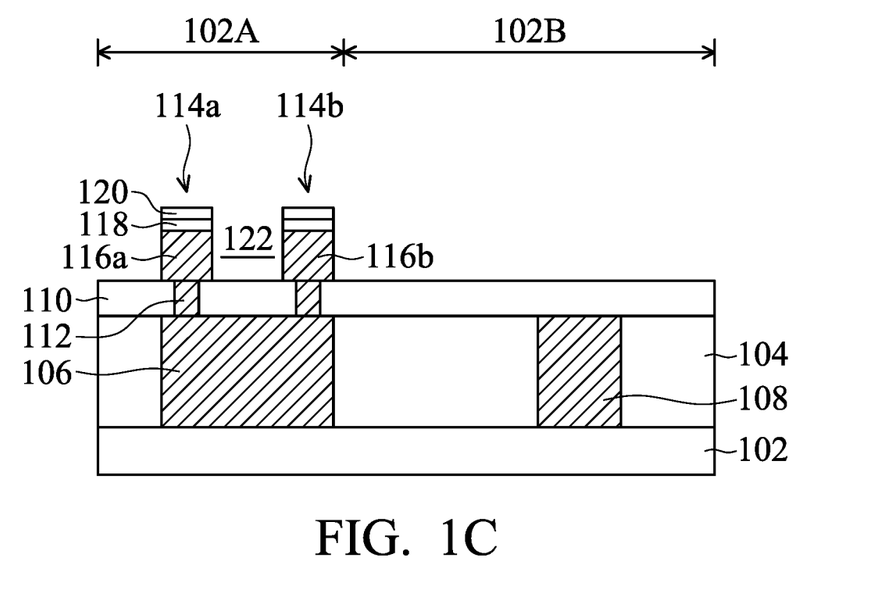

Next, a first stack structure 114a and a second stack structure 114b are formed on the dielectric layer 110 as shown in 1C. The first stack structure 114a and the second stack structure 114b are formed on the first region 102A. In some embodiments, the first stack structure 114a and the second stack structure 114b include a first conductive pad 116a and a second conductive pad 116b, respectively. The first conductive pad 116a and the second conductive pad 116b are electrically connected to the interconnection structure 106 through the via structures 112. In some embodiments, the material of the first conductive pad 116a and the second conductive pad 116b is aluminum (Al) or another metal material.

As shown in FIG. 1C, the first stack structure 114a and the second stack structure 114b include a barrier layer 118 formed on the first conductive pad 116a and the second conductive pad 116b, and an anti-reflective layer 120 formed on the barrier layer 118. In some embodiments, the barrier layer 118 includes a metal nitride such as titanium nitride (TiN). The barrier layer 118 is configured to prevent the first conductive pad 116a and the second conductive pad 116b from being damaged by the etchant that includes fluorine (F) which is used in the subsequent etching process. In some embodiments, the anti-reflective layer 120 includes or is made of silicon oxynitride (SiON), silicon carbide (SiOC) or another applicable anti-reflective material. The anti-reflective layer 120 is configured to prevent the metal underneath from reflecting, which may result in a position or profile deviation of the first stack structure 114a and the second stack structure 114b during the patterning of the material of the first conductive pad 116a, the second conductive pad 116b and the barrier layer 118.

In some embodiments, a metal material layer, a metal nitride layer, and an anti-reflective material layer are sequentially deposited on the dielectric layer 110. Next, a photolithography and an etching process are performed to pattern the aforementioned material layers. As a result, the first stack structure 114a and the second stack structure 114b are formed on the first region 102A. In some embodiments, as shown in FIG. 1C, a trench 122 is formed between the first stack structure 114a and the second stack structure 114b after the patterning process.

Figure 1D:
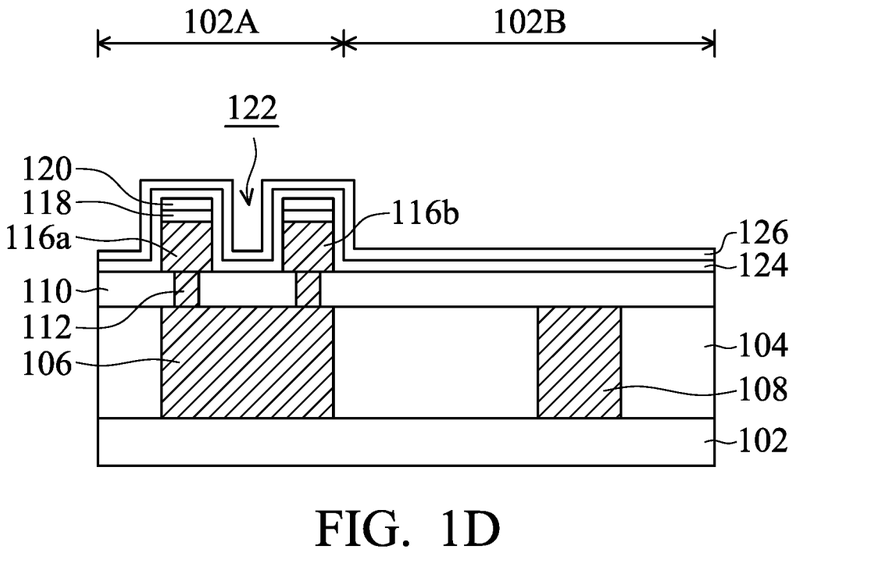

In some embodiments, as shown in FIG. 1D, a capping layer 124 and an etching stop layer 126 are sequentially deposited on the first region 102A and the second region 102B. As shown in FIG. 1D, the capping layer 124 covers the top surface of the dielectric layer 110, and covers the side surface and the top surface of the first stack structure 114a and the second stack structure 114b. In addition, the etching stop layer 126 covers the capping layer 124. As shown in FIG. 1D, the capping layer 124 and the etching stop layer 126 are filled into the trench 122 that is located between the first stack structure 114a and the second stack structure 114b. In some embodiments, the capping layer 124 includes oxide such as silicon oxide. In some embodiments, the etching stop layer 126 includes nitride or metal oxide. In some embodiments, during the subsequent etching process, the etching rate of the material of the etching stop layer 126 is less than that of the capping layer 124. In some embodiments, the etching stop layer 126 includes silicon nitride and aluminum oxide.

In some embodiments, the thickness of the capping layer 124 is in a range of about 50 nm to about 150 nm. In some embodiments, the thickness of the etching stop layer 126 is in a range of about 50 nm to about 150 nm. In some embodiments, the capping layer 124 and the etching stop layer 126 are formed by atomic layer deposition (ALD) process so that the capping layer 124 and the etching stop layer 126 are conformally formed on the first stack structure 114a and the second stack structure 114b.

Figure 1E:
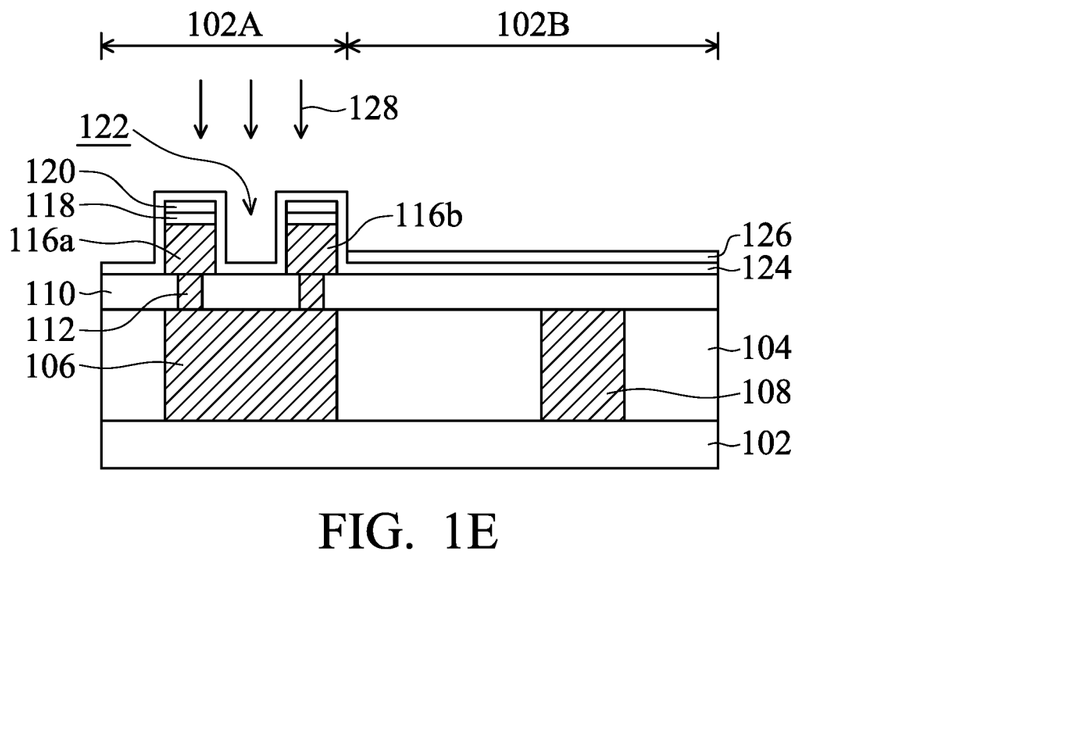

In some embodiments, as shown in FIG. 1E, a first etching process 128 is performed to remove the portion of the etching stop layer 126 that is located on the first region 102A. As a result, the portion of the capping layer 124 over the first region 102A is exposed. In some embodiments, the first etching process 128 includes wet etching process. In some embodiments, a photoresist layer (not shown) is formed on the second region 102B to cover the etching stop layer 126. Next, the first etching process 128 is performed to remove the portion of the etching stop layer 126 that is on the first region 102A. In some embodiments, the etchant of the first etching process 128 includes phosphoric acid ($H_3PO_4$), and the temperature during the first etching process 128 is in a range of about 150° C. to about 200° C. The photoresist layer on the second region 102B is removed after the first etching process 128 has been performed.

In some embodiments, as shown in FIG. 1E, the capping layer 124 protects the sidewalls of the first conductive pad 116a and the second conductive pad 116b from being damaged by the etchant used in the first etching process 128. In some embodiments, as shown in FIG. 1E, the etching stop layer 126 filled into the trench 122 is removed after the first etching process 128. As a result, there is substantially no etching stop layer 126 in the trench 122. In some embodiments, the etching stop layer 126 is made of a high-k dielectric material, and the removal of the etching stop layer 126 that fills the trench 122 can prevent higher parasitic capacitance from being generated between the first conductive pad 116a and the second conductive pad 116b.

Figure 1F:
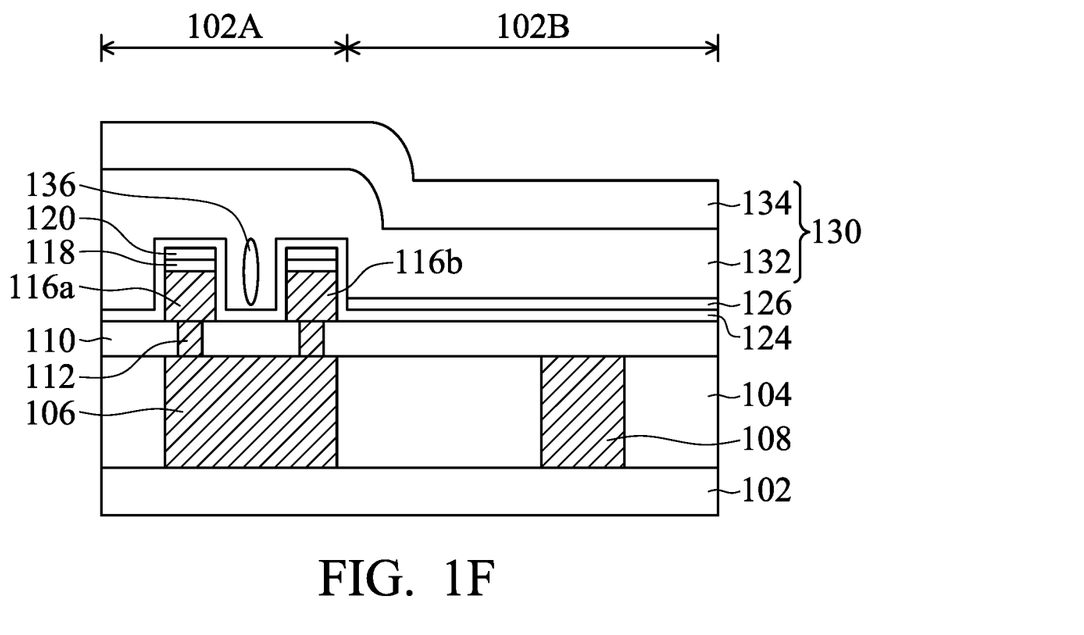

Next, as shown in FIG. 1F, a composite dielectric layer 130 is deposited on the first region 102A and the second region 102B. In some embodiments, the composite dielectric layer 130 includes a dielectric layer 132 and a dielectric layer 134 as shown in FIG. 1F. Many variations and/or modifications can be made to embodiments of the disclosure. In some embodiments, the composite dielectric layer 130 further includes more different dielectric material layers. The dielectric layer 132 may be a low-k dielectric layer such as silicon oxide or another dielectric layer. The dielectric layer 134 may be silicon nitride or another dielectric material. In some embodiments, the thickness of the dielectric layer 132 is in a range of about 700 nm to about 1100 nm. The thickness of the dielectric layer 134 is in a range of about 300 nm to about 600 nm. In some embodiments, the dielectric constant of the dielectric layer 132 is less than that of the etching stop layer 126. In some embodiments, the dielectric constant of the capping layer 124 is less than that of the etching stop layer 126.

As shown in FIG. 1F, when the material of the dielectric layer 132 is filled into the trench 122 that is located between the first stack structure 114a and the second stack structure 114b, a void 136 is formed. The void 136 is made of air. Due to the lower dielectric constant of the air, the formation of the void 136 can prevent higher parasitic capacitance from being generated between the first conductive pad 116a and the second conductive pad 116b.

Furthermore, the capping layer 124 and the dielectric layer 132 are filled into the trench 122 so that higher parasitic capacitance is prevented from being generated between the first conductive pad 116a and the second conductive pad 116b due to the lower dielectric constant of the capping layer 124 and the dielectric layer 132.

In some embodiments, as shown in FIG. 1F, the dielectric layer 132 is in direct contact with the top surface of the capping layer 124 in the first region 102A. In addition, the dielectric layer 132 is in direct contact with the top surface of the etching stop layer 126 in the second region 102B. In some embodiments, the material of the dielectric layer 132 is the same as that of the capping layer 124. In some embodiments, the material of the dielectric layer 132 is different from that of the capping layer 124.

Figure 1G:
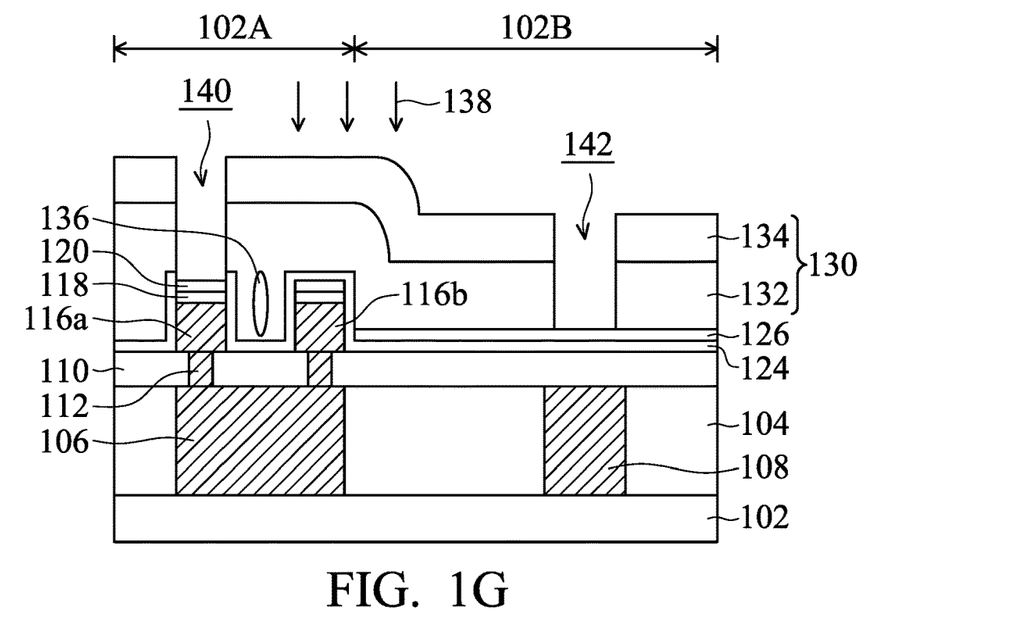

Next, as shown in FIG. 1G, a second etching process 138 is performed to form a first opening 140 in the first region 102A and a second opening 142 in the second region 102B. In some embodiments, as shown in FIG. 1G, the first opening 140 is located directly over the first conductive pad 116a, and the second opening 142 is located directly over the fuse structure 108. In some embodiments, a photoresist layer (not shown) is formed to cover the dielectric layer 134 followed by performing the second etching process 138.

In some embodiments, the second etching process 138 may be a dry etching process such as reactive ion etching (RIE) or high-density plasma. In some embodiments, the etchant of the second etching process 138 includes halide such as fluorine (F). The etchant with the fluorine (F) includes $CH_3F$, $CH_2F_2$, $CHF_3$, $CF_4$ or another suitable gas.

The etchant with fluorine (F) has a higher etching rate than oxide such as silicon oxide, and a lower etching rate than nitride or metal oxide such as silicon nitride or aluminum oxide. In some embodiments where the capping layer 124 is made of oxide, the etching stop layer 126 is made of nitride or metal oxide, and the second etching process 138 has a higher etching rate than the capping layer 124 and a lower etching rate than the etching stop layer 126. In some embodiments, while performing the second etching process 138, the dielectric layer 132 has a first etching rate, the etching stop layer 126 has a second etching rate, and the capping layer 124 has a third etching rate. The first etching rate and the third etching rate are greater than the second etching rate. When the composite dielectric layer 130 is removed, the anti-reflective layer 120 is exposed by the first opening 140 and the etching stop layer 126 is exposed by the second opening 142. In this embodiment, when the capping layer 124 in the first opening 140 is completely removed, the etching stop layer 126 exposed from the first opening 140 is not consumed excessively. As shown in FIG. 1G, when the second etching process 138 is performed to a middle stage, the composite dielectric layer 130 and the capping layer 124 that are in the first region 102A are removed so that the top surface of the anti-reflective layer 120 is exposed by the first opening 140. In addition, when the composite dielectric layer 130 in the second region 102B is removed, the top surface of the etching stop layer 126 is exposed by the second opening 142. In some embodiments, when the anti-reflective layer 120 exposed by the first opening 140 is partially removed, the etching stop layer 126 exposed by the second opening 142 is not completely removed.

Due to the thicker thickness of the dielectric layer 132, more time is needed to remove the dielectric layer 132. Therefore, when a large amount of the dielectric layer 132 is removed, the uniformity of the exposed top surface may not be good. In this embodiment, the etching stop layer 126 is disposed to prevent the capping layer 124 and the dielectric layer 110 from being etched immediately after the removal of the dielectric layer 132. If the capping layer 124 and the dielectric layer 110 are etched immediately after the removal of the dielectric layer 132, it may lead to greater uniformity of the etched top surface of the dielectric layer 110 due to the high etching rate of the capping layer 124 and the dielectric layer 110 being the same as the dielectric layer 132.

Furthermore, the second etching process 138 has a lower etching rate than the barrier layer 118. Therefore, adjusting the thickness of the barrier layer 118 and the etching stop layer 126 may allow the barrier layer 118 and the etching stop layer 126 in the openings to be completely removed at the same time. Alternatively, in some embodiments, when the etching stop layer 126 in the second opening 142 is completely removed, a portion of the barrier layer 118 remains on the first conductive pad 116a. In this embodiment, during the second etching process 138, the barrier layer 118 has a fourth etching rate that is lower than the third etching rate.

Figure 1H:
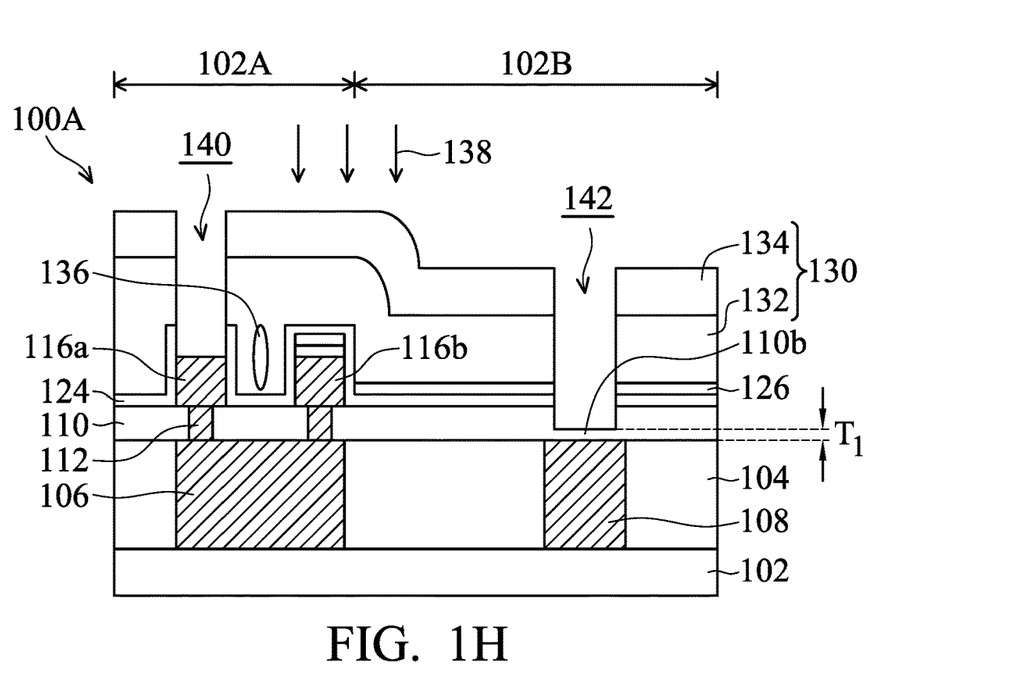

Next, as shown in FIG. 1H, the second etching process 138 is continually performed until the barrier layer 118 and the anti-reflective layer 120 in the first opening 140 are completely removed so that the top surface of the first conductive pad 116a is exposed. In addition, the etching stop layer 126 and the capping layer 124 in the second opening 142 are completely removed. Furthermore, a portion of the dielectric layer 110 is removed so that a fuse window 110b is formed on the fuse structure 108. As a result, a semiconductor device 100A is created. As shown in FIG. 1H, the fuse window 110b has a thickness T1. In some embodiments, the thickness T1 is in a range of about 50 nm to about 150 nm.

As mentioned above, the barrier layer 118 and the etching stop layer 126 in the first and second openings are completely removed at the same time during the second etching process 138, or a portion of the barrier layer 118 remains on the first conductive pad 116a when the etching stop layer 126 in the second opening 142 is completely removed. As a result, when the dielectric layer 110 is removed until the dielectric layer 110 is the desired thickness, the first conductive pad 116a is not exposed to the etchant for too long. Therefore, the formation of a metal fluoride such as aluminum fluoride ($AlF_3$) due to the interaction between the etchant with fluorine (F) and the top surface of the first conductive pad 116a is prevented. If metal fluoride is formed, it may cause the subsequent filled metal material to not be electrically connected to the first conductive pad 116a.

Moreover, as shown in FIGS. 1G and 1H, the etching stop layer 126 may be used as a buffer layer to form the first opening 140 and the second opening 142 simultaneously. In addition, the etching stop layer 126 may prevent the formation of metal fluoride on the first conductive pad 116a while the dielectric layer 110 is the desired thickness. In this embodiment, the etchant containing halide has a lower etching rate than the etching stop layer 126, and a higher etching rate than the dielectric layer 132. In this embodiment, the etchant containing fluoride (F) has a lower etching rate than the etching stop layer 126, and a higher etching rate than the dielectric layer 132.

Figure 2:
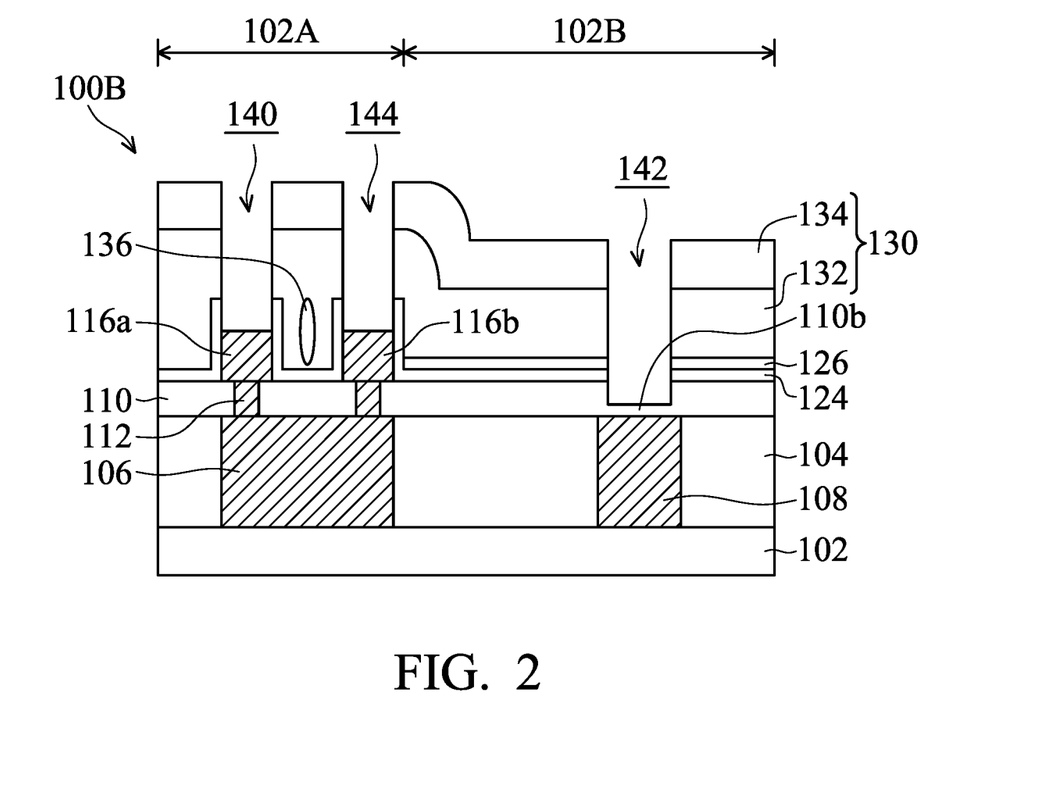
FIG. 2 is a cross-sectional view of a semiconductor device in accordance with some embodiments.

Many variations and/or modifications can be made to embodiments of the disclosure. Refer to FIG. 2, which is a cross-sectional view of a semiconductor device 100B in accordance with some embodiments. One of the differences between semiconductor device 100B and semiconductor device 100A shown in FIG. 1H is that a third opening 144 is formed so that the top surface of the second conductive pad 116b is exposed after the second etching process 138 is performed.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the material layers, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device, comprising:
providing a semiconductor substrate, wherein the semiconductor substrate has a first region and a second region adjacent to the first region;
forming an interconnection structure on the first region of the semiconductor substrate and a fuse structure on the second region of the semiconductor substrate;
forming a first conductive pad on the interconnection structure, wherein the first conductive pad is electrically connected to the interconnection structure;
forming a capping layer to cover the first conductive pad and the fuse structure;
forming an etching stop layer to cover the capping layer;
forming a first dielectric layer to cover the etching stop layer; and
performing a first etching process to remove the first dielectric layer, the etching stop layer and the capping layer so that a first opening is formed in the first region to expose the first conductive pad and a second opening is formed above the fuse structure, wherein during the first etching process, the first dielectric layer has a first etching rate, and the etching stop layer has a second etching rate that is lower than the first etching rate;
wherein the capping layer comprises silicon oxide, and the etching stop layer comprises silicon nitride or aluminum oxide.

2. The method for manufacturing a semiconductor device as claimed in claim 1, wherein the first etching process comprises a dry etching process.

3. The method for manufacturing a semiconductor device as claimed in claim 2, wherein an etchant of the dry etching process comprises fluorine (F).

4. The method for manufacturing a semiconductor device as claimed in claim 1, further comprising:
forming a second dielectric layer to cover the interconnection structure and the fuse structure before forming the first conductive pad, wherein a portion of the second dielectric layer on the second region is removed during the first etching process.

5. The method for manufacturing a semiconductor device as claimed in claim 1, wherein during the first etching process, the capping layer has a third etching rate that is greater than the second etching rate.

6. The method for manufacturing a semiconductor device as claimed in claim 5, further comprising:
forming a barrier layer on the first conductive pad, wherein the barrier layer has a fourth etching rate that is lower than the third etching rate during the first etching process.

7. The method for manufacturing a semiconductor device as claimed in claim 1, wherein the first dielectric layer has a first thickness, and the etching stop layer has a second thickness that is less than the first thickness.

8. A method for manufacturing a semiconductor device comprising:
providing a semiconductor substrate, wherein the semiconductor substrate has a first region and a second region adjacent to the first region;
forming an interconnection structure on the first region of the semiconductor substrate and a fuse structure on the second region of the semiconductor substrate;
forming a first conductive pad on the interconnection structure, wherein the first conductive pad is electrically connected to the interconnection structure;
forming a capping layer to cover the first conductive pad and the fuse structure;
forming an etching stop layer to cover the capping layer;
forming a first dielectric layer to cover the etching stop layer; and
performing a first etching process to remove the first dielectric layer, the etching stop layer and the capping layer so that a first opening is formed in the first region to expose the first conductive pad and a second opening is formed above the fuse structure, wherein during the first etching process, the first dielectric layer has a first etching rate, and the etching stop layer has a second etching rate that is lower than the first etching rate,
wherein a second etching process is performed before forming the first dielectric layer to remove the etching stop layer on the first region, and to expose the capping layer on the first region.

9. The method for manufacturing a semiconductor device as claimed in claim 8, wherein the second etching process comprises a wet etching process.

10. The method for manufacturing a semiconductor device as claimed in claim 8, forming a second conductive pad on the first region so that there is a trench formed between the first conductive pad and the second conductive pad, wherein performing the second etching process comprises removing the etching stop layer in the trench.

11. A semiconductor device, comprising:
a semiconductor substrate, wherein the semiconductor substrate has a first region and a second region adjacent to the first region;
an interconnection structure and a fuse structure disposed on the first region and the second region of the semiconductor substrate, respectively;
a first dielectric layer covering the interconnection structure and the fuse structure;
a first conductive pad disposed on the interconnection structure, wherein the first conductive pad is electrically connected to the interconnection structure;
a capping layer disposed on the first region and the second region of the semiconductor substrate, wherein the capping layer covers a sidewall of the first conductive pad;
an etching stop layer disposed on the second region of the semiconductor substrate, wherein the etching stop layer covers the capping layer;
a second dielectric layer disposed on the etching stop layer and the capping layer; and
a first opening disposed on the fuse structure and the second region of the semiconductor substrate, wherein the first opening removes the second dielectric layer, the etching stop layer, the capping layer and a portion of the first dielectric layer.

12. The semiconductor device as claimed in claim 11, wherein the capping layer comprises silicon oxide.

13. The semiconductor device as claimed in claim 11, wherein the etching stop layer comprises nitride or metal oxide.

14. The semiconductor device as claimed in claim 11, wherein the etching stop layer comprises silicon nitride or aluminum oxide.

15. The semiconductor device as claimed in claim 11, further comprising:
a second conductive pad disposed on the first region and the first dielectric layer; and
a trench located between the first conductive pad and the second conductive pad, wherein there is no etching stop layer in the trench.

16. The semiconductor device as claimed in claim 11, wherein the capping layer is in direct contact with the second dielectric layer in the first region, and the etching stop layer is in direct contact with the second dielectric layer in the second region.

17. The semiconductor device as claimed in claim 11, wherein the second dielectric layer comprises silicon oxide.

18. The semiconductor device as claimed in claim 11, wherein the second dielectric layer has a first thickness, and the etching stop layer has a second thickness that is less than the first thickness.

19. The semiconductor device as claimed in claim 11, wherein the etching stop layer has a thickness of 50nm to 150nm.

* * * * *